United States Patent
Palmer et al.

(10) Patent No.: US 6,862,208 B2
(45) Date of Patent: Mar. 1, 2005

(54) MEMORY DEVICE WITH SENSE AMPLIFIER AND SELF-TIMED LATCH

(75) Inventors: Jeremiah T. C. Palmer, Pflugerville, TX (US); Perry H. Pelley, III, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/412,490

(22) Filed: Apr. 11, 2003

(65) Prior Publication Data

US 2004/0202014 A1 Oct. 14, 2004

(51) Int. Cl.$^7$ .............................................. G11C 11/00
(52) U.S. Cl. ...................................... 365/154; 365/205
(58) Field of Search ................................. 365/145, 222, 365/205, 154

(56) References Cited

U.S. PATENT DOCUMENTS 5,701,268 A * 12/1997 Lee et al. .................... 365/205
6,101,145 A    8/2000 Nicholes .................. 365/230.01
6,445,632 B2 * 9/2002 Sakamoto .................... 365/205

* cited by examiner

*Primary Examiner*—M. Tran
(74) *Attorney, Agent, or Firm*—David G. Dolezal; Daniel D. Hill

(57) ABSTRACT

A memory device (201) includes a plurality of memory cells (203), bit lines, word lines, a sense amplifier (314), and a self-timed latch (215). The sense amplifier (314), responsive to a sense enable signal, is for sensing and amplifying a voltage on the bit lines corresponding to a stored logic state of a selected one of the plurality of memory cells. An isolation circuit (306, 308) is coupled between the bit lines (205 and 207) and the sense amplifier (314). The isolation circuit (306, 308) is for decoupling the selected one of the plurality of memory cells from the sense amplifier (314) at about the same time that the sense enable signal is asserted. A self-timed latch (215) is coupled to the sense amplifier (314). The self-timed latch (215) does not receive a clock signal and is responsive to only the amplified voltage.

32 Claims, 4 Drawing Sheets

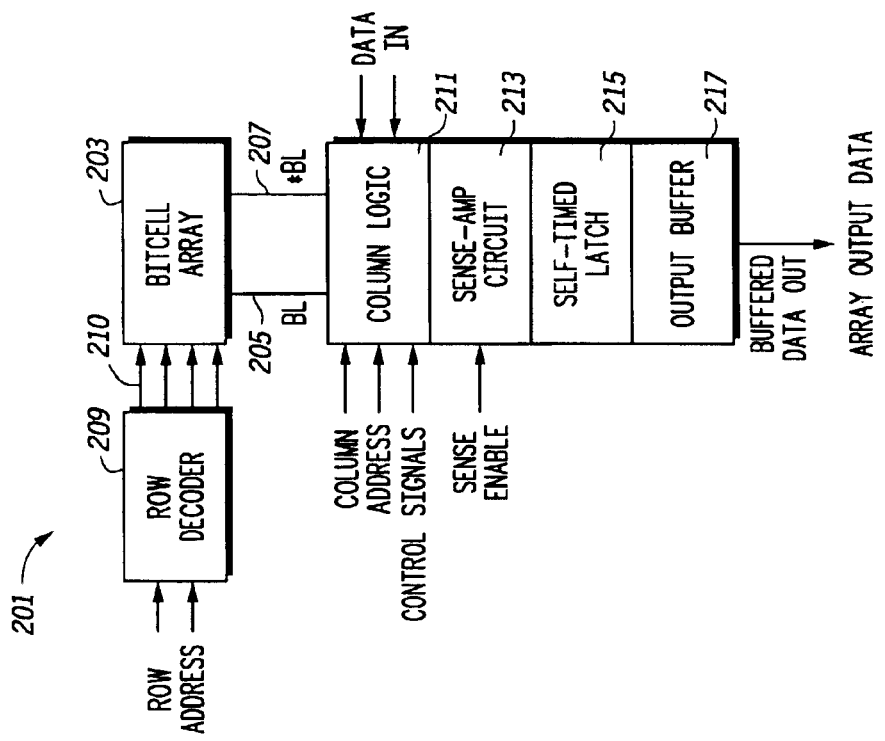
FIG.2
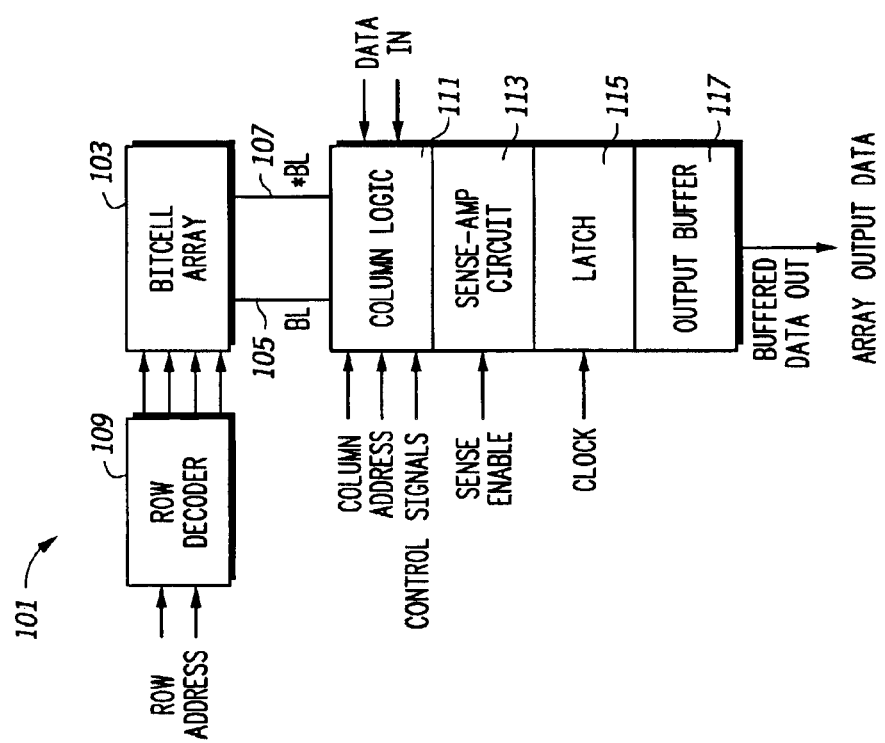
FIG.1 –PRIOR ART–

MEMORY DEVICE WITH SENSE AMPLIFIER AND SELF-TIMED LATCH

BACKGROUND OF THE INVENTION

1. Field of the Invention

This invention relates in general to integrated circuits and in particular to memory devices.

2. Description of the Related Art

Memory devices such as e.g. a Random Access Memory (RAM) include sense amplifiers for providing a signal indicative of a value stored in a memory cell of an array coupled to the sense amplifier.

FIG. 1 shows a prior art memory device. Memory device 101 includes a bitcell array 103 having a plurality of memory cells, each for storing a bit of data. The memory cells of bitcell array 103 are each coupled to a pair of differential bit lines BL 105 and *BL 107. Each cell in array 103 is coupled to a word line, which is coupled to row decoder 109. Memory device 101 also includes a column logic 111, sense amplifier circuit 113, latch 115, and output buffer 117. Column logic 111 includes precharge and equalization circuitry, write circuitry, column decode circuitry, and isolation transistors. Latch 115 receives a capacity CLOCK timing signal for enabling latch 115 to sample data from the output of sense amplifier circuit 113. The second amplifier circuit 113 is enabled by a SENSE ENABLE signal.

For memory devices having multiple sense amplifier circuits and latches, providing a clock signal to each latch places a large load on a clock generating circuit, thereby consuming power and degradating the performance of the clock signal. Furthermore, enabling latch 115 with a clock signal requires specific setup and hold time requirements to be maintained between the clock signal and the sense enable signal. Variation in the performance of the memory device may result in the failure to latch the output of the sense amplifier circuit 113. In addition, a latch requires extra circuitry to handle the clock signal. Furthermore, having a latch circuit with a clock input may also introduce unnecessary delay in the operation of a memory device.

What is needed is an improved memory device.

BRIEF DESCRIPTION OF THE DRAWINGS

The present invention may be better understood, and its numerous objects, features, and advantages made apparent to those skilled in the art by referencing the accompanying drawings.

FIG. 1 is a block diagram of a prior art memory device.

FIG. 2 is a block diagram of one embodiment of a memory device according to the present invention.

The use of the same reference symbols in different drawings indicates identical items unless otherwise noted.

DETAILED DESCRIPTION

Figure 3:
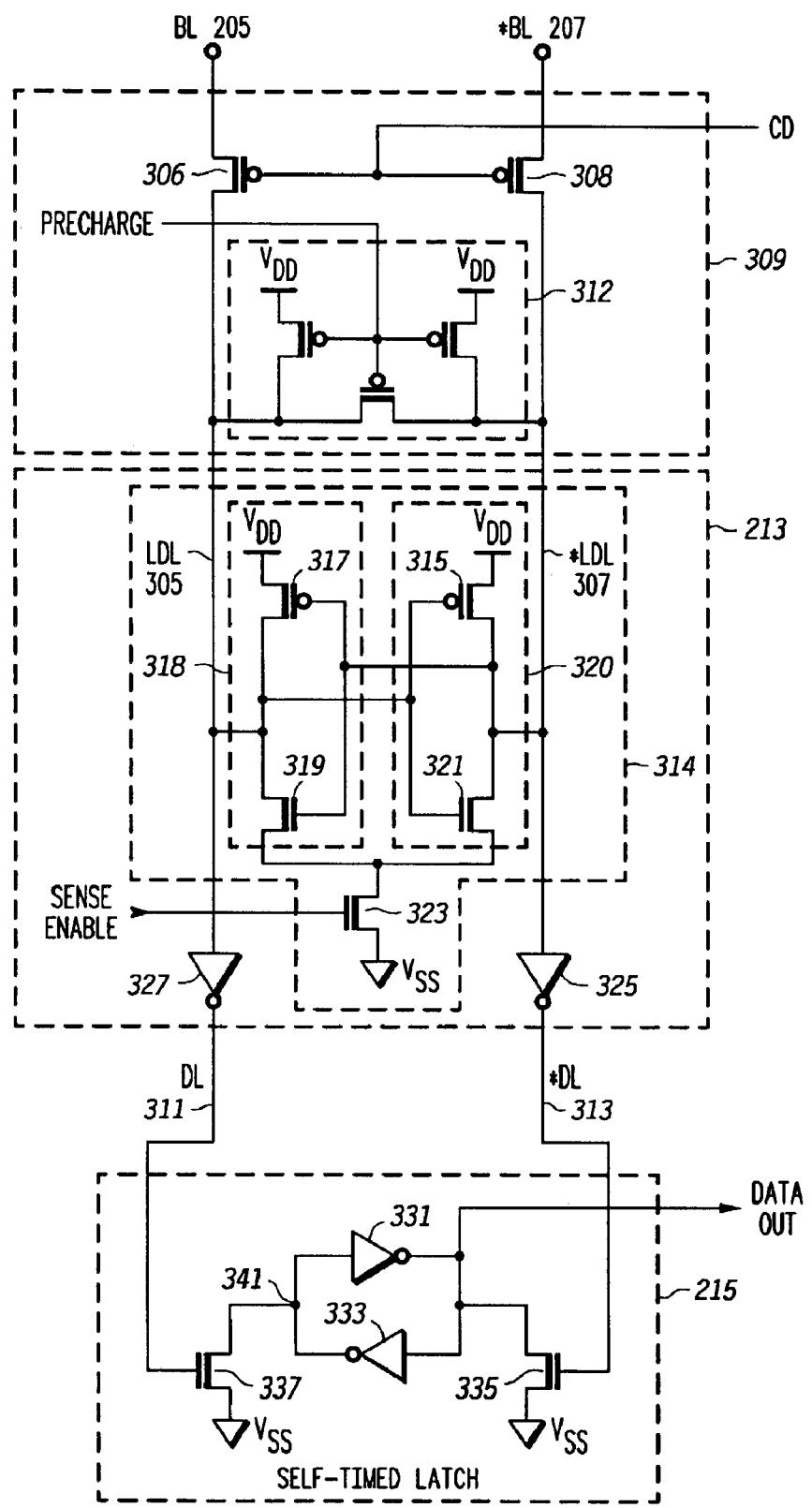
FIG. 3 is circuit diagram of one embodiment of a portion of the memory device of FIG. 2, including the sense amplifier circuit and self-timed latch according to the present invention.

The following sets forth a detailed description of a mode for carrying out the invention. The description is intended to be illustrative of the invention and should not be taken to be limiting.

FIG. 2 is a block diagram of a memory device according to the present invention. Memory device 201 includes a bitcell array 203 having a plurality of memory cells, each for storing a bit of data. In one embodiment, memory device 201 is an SRAM memory and the memory cells of bitcell array 203 are 6 transistor SRAM cells. However in other embodiments, other types of memory cells may be utilized in a memory device such as, e.g., other types of SRAM, DRAM, MRAM, Flash Memory, ROM, EPROM, EEPROM, ferromagnetic, or other types of memory cells. In some embodiments, each cell in bitcell array 203 stores multiple bits. The memory cells of bitcell array 203 are each coupled to a pair of differential bit lines BL 205 and *BL 207. Each cell in array 203 is coupled to a word line (e.g. 210), which are controlled by row decoder 209. Row decoder 209 receives at its input, a row address which it decodes to assert the word line designated by the row address. Memory device 201 also includes column logic 211. In one embodiment, column logic includes precharge and equalization circuitry, write circuitry, column decode circuitry, and isolation transistors (e.g. 306 and 308 in FIG. 3). The column logic has inputs coupled to column address lines and coupled to data in lines for data writes to the memory cells. In some embodiments, column logic 211 may also be coupled to multiple pairs of bit lines, wherein column logic 211 performs a column decode function in coupling a selected column to sense amplifier circuit 213.

Sense amplifier circuit 213 amplifies a difference in local data lines (e.g. LDL 305 and *LDL 307 in FIG. 3) during a read cycle for the determination of the value of a bit stored in a memory element of a memory cell of bitcell array 203. The value of a bit stored in a memory element corresponds to the logic state of the memory element. Sense amplifier circuit 213 is enabled to amplify a difference in the local data lines by a SENSE ENABLE signal.

Memory device 201 includes a self-timed latch 215. Self-timed latch 215 is a data storage device that stores data provided from the sense amplifier circuit 213. In one embodiment, self-timed latch 215 stores data only in response to receiving an amplified differential data signal from sense amplifier circuit 213. Self-timed latch 215 does not have an input for a clock signal. The output of self-timed latch 215 is provided to an output buffer which provides a buffered data output signal indicating the value of the bit stored in the selected memory cell.

FIG. 3 is a schematic diagram showing one embodiment of sense amplifier circuit 213, self-timed latch 215, and a portion 309 of column logic 211 (hereafter "circuit portion 309"). Circuit portion 309 includes two isolation transistors 306 and 308 for isolating bit lines BL 205 and *BL 207 from sense amplifier circuit 213. The "*" in front of a signal line indicates that that signal line is a logical complement of the signal line having the same name but without the "*". Isolation transistors 306 and 308 are controlled by an isolation control signal (CD). In one embodiment, the isolation control signal (CD) is provided by a column decoder (not shown) of the column logic 211 and is a decoded signal from the column address provided to column logic 211. Circuit portion 309 also includes a precharge and equalization circuit 312 for precharging local data lines LDL 305 and *LDL 307. Having a precharge and equalization circuit 312 on the opposite side of isolation transistors 306 and 308 from the bit lines allows for a sense amplifier 314 of sense amplifier circuit 213 to be precharged while cells of bitcell array 203 are being written during a write cycle.

Sense amplifier 314 includes a pair of cross coupled inverters 318 and 320. Inverter 318 is formed from transistors 317 and 319 and inverter 320 is formed from transistors 315 and 321. Transistors 319 and 321 each include a current electrode connected to a current electrode of transistor 323. Transistor 323 receives the SENSE ENABLE signal at its control electrode. Sense amplifier 314 amplifies the difference in voltage between the local data lines LDL 305 and *LDL 307 in response to the assertion of the SENSE ENABLE signal. In one embodiment, when the SENSE ENABLE signal is asserted, sense amplifier 314 senses which of the local data lines (LDL 305 or *LDL 307) has the lower voltage due to a differential data signal from a selected bitcell of array 203 via the bit lines and transistors 306 and 308. Sense amplifier 314 then drives that local data line to a voltage of power supply terminal VSS and drives the other local data line to the voltage of the power supply terminal VDD to provide an amplified differential data signal.

In the embodiment shown, sense amplifier circuit 213 also includes buffers (e.g. inverters 327 and 325) for isolating sense amplifier 314 from self-timed latch 215. In other embodiments, sense amplifier circuit 213 does not include buffers. In still other embodiments, non inverting buffers may be utilized in place of inverters 327 and 325.

Self-timed latch 215 includes transistors 337 and 335 whose control electrodes are connected to data lines DL 311 and *DL313, respectively. Transistors 337 and 335 each include a current terminal coupled to cross coupled inverters 331 and 333. Self-timed latch 215 outputs data at its output, which is connected to the output terminal of inverter 331 and the input terminal of inverter 333. Self-timed latch 215 provides at its output (DATA OUT) a value that corresponds to the value of the amplified differential data signal received on differential data lines DL311 and *DL313 in response to receiving the amplified differential data signal.

Figure 4:
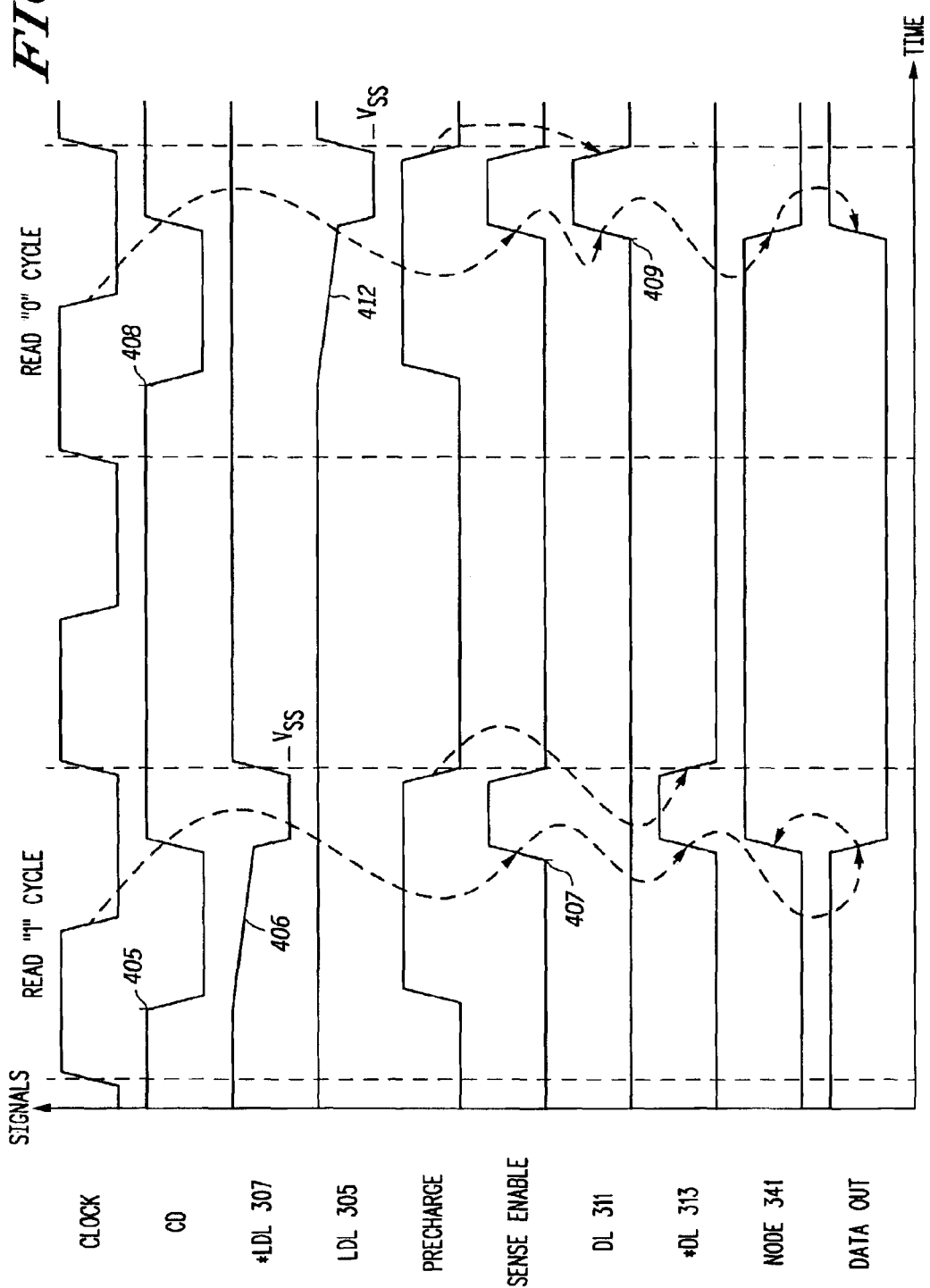
FIG. 4 is a timing diagram for one embodiment of a memory device according to the present invention.

FIG. 4 shows one embodiment of a timing diagram for the circuit of FIG. 3 during two read cycles. The portion of the timing diagram labeled READ "1" CYCLE indicates the voltage values of various nodes, signals, and data lines during a read cycle of a selected memory cell of bit array 203 having a stored logic state indicative of a value of "1". The portion of the timing diagram labeled READ "0" CYCLE indicates the voltage values of various nodes, signals, and data lines during a read cycle of a selected memory cell of bit array 203 having a stored logic state indicative of a value of "0". The designation of a stored logic state to a value is arbitrary in that with some embodiments, the logic state of a memory cell that designates a "1" may designate a "0" in other embodiments. The CLOCK signal is provided by clock circuitry (e.g. 511 of FIG. 5) external to the memory device.

During a read cycle, the CD signal is driven low (e.g. at 405) to couple the local data lines LDL 305 and *LDL307 to bit lines BL 205 and *BL 207, respectively. During this time, a memory cell in bitcell array 203 is selected for reading by activating the word line (e.g. 210) associated with that bitcell. Also when the CD signal is driven low, the PRECHARGE signal is driven high to deactivate the precharge of local data lines LDL 305 and *LDL 307 by precharge and equalization circuit 312. Coupling the local data lines LDL 305 and *LDL 307 to bit lines BL 205 and *BL 207, respectively, and deactivating the precharge and equalization circuit 312 allows the local data lines LDL 305 and *LDL 307 to be coupled to the selected bitcell to develop a voltage differential across LDL 305 and *LDL 307 that is dependent upon the logic state stored in the selected memory cell. For the embodiment shown, because a logic state designating a "1" is stored in the selected memory cell, the voltage of *LDL 307 is pulled to a lower voltage level (see sloped line 406) than that of the voltage level of LDL 305 with the assertion of the CD signal.

After a predetermined period of time from when the CD signal is driven low at 405, the SENSE ENABLE signal is asserted (the SENSE ENABLE signal is an active high signal) at 407. The SENSE ENABLE signal, as well as the CD signal and the PRECHARGE signal, are logically derived from the CLOCK signal. Asserting the SENSE ENABLE signal triggers sense amplifier 314 to drive *LDL 307 to a voltage level of power supply voltage terminal VSS. At about the time that the SENSE ENABLE signal is asserted, the CD signal is driven high to isolate the local data lines LDL 305 and *LDL 307 from bit lines BL 205 and *BL 207, respectively. Isolating the local data lines (e.g. LDL 305 and *LDL 307) from the bit lines (BL 205 and *BL 207) may allow for sense amplifier 314 to amplify the differential data signal on the local data lines faster than if they were coupled to the bit lines, in that the capacitance on the local data lines is reduced when they are not coupled to the bit lines.

Because *LDL 307 is connected to the input terminal of inverter 325 and data line *DL 313 is connected to the output terminal of inverter 325, pulling *LDL 307 to VSS drives *DL 313 high. Because DL 311 is coupled to LDL 305 through inverter 327, DL 311 remains at a low voltage level. In response to *DL 313 going to a high level to indicate that a "1" is stored in the selected memory cell, the DATA OUT signal transitions to a low state. DL *313 going to a high level makes transistor 335 conductive, over powering inverter 331 and pulling the input terminal of inverter 333 low. In response to the input terminal of inverter 333 being pull low, the input terminal of inverter 331 (node 341) is pull high, thereby pulling the DATA OUT signal low.

When the SENSE ENABLE signal is deasserted and precharge and equalization circuit 312 is enabled by the PRECHARGE signal going low, local data line *LDL 307 is pulled back to VDD, thereby pulling *DL 313 low, which turns off transistor 335. However, because of the latch function of self-timed latch 215, the voltage level of the DATA OUT signal remains latched at the low voltage level. Accordingly, self-timed latch 215 provides a value indicative of the contents of the selected memory cell after the local data lines and sense amplifier 314 are being precharged.

The value of the DATA OUT signal remains at same level indicating a value until an opposite value is sensed by the sense amplifier during a subsequent memory read cycle. For example, the voltage of the DATA OUT signal remains at a low level until a "0" value is sensed by sense amplifier 314 during a subsequent memory read cycle.

During the READ "0" CYCLE, the CD signal is driven low (e.g. at 408) to couple local data lines LDL 305 and *LDL 307 to bit lines BL 205 and *BL 207, respectively. During this time, a memory cell in bitcell array 203 is selected for reading by activating the word line (e.g. 210) associated with that bitcell. Also when the CD signal is driven low, the PRECHARGE signal is driven high to deactivate the precharge of local data lines LDL 305 and *LDL 307 by precharge and equalization circuit 312. Because a "0" is stored in the selected memory cell, the voltage of LDL 305 is pulled to a lower voltage level than that of the voltage level of *LDL 307 (see sloped line 412 in FIG. 4).

After a predetermined period of time from when the CD signal is driven low at 408, the SENSE ENABLE signal is asserted at 409. Asserting the SENSE ENABLE signal triggers sense amplifier 314 to drive LDL 305 to the voltage level of power supply voltage terminal VSS. At about the time that the SENSE ENABLE signal is asserted, the CD signal is driven high to isolate the local data lines LDL 305 and *LDL 307 from bit lines BL 205 and *BL 207, respectively.

Because LDL 305 is connected to the input terminal of inverter 327 and data line DL 311 is connected to the output terminal of inverter 327, pulling LDL 305 to VSS drives DL 311 high. Because *DL 313 is coupled to *LDL 307 through inverter 325, *DL 313 remains at a low voltage level. In response to DL 311 going to a high level to indicate that a "0" is stored in the selected memory cell, the DATA OUT signal transitions to a high voltage level. DL 311 going to a high voltage level makes transistor 337 conductive, over powering inverter 333 and pulling the input terminal (node 341) of inverter 331 low. In response to the input terminal of inverter 331 being pulled low, the input terminal of inverter 333 and the DATA OUT signal are pulled to a high voltage level.

When the SENSE ENABLE signal is deasserted and precharge and equalization circuit 312 is enabled by the PRECHARGE signal going low, local data line LDL 305 is pulled back to VDD, thereby pulling DL 311 low, which turns off transistor 337. However, because of the latch function of self-timed latch 215, the voltage level of the DATA OUT signal remains latched at the high voltage level.

Providing a self-timed latch that is responsive only to the output of a sense amplifier circuit may allow for the latch to latch a value immediately after the sense amplifier provides an amplified data signal as opposed to a clocked latch which has specific setup and hold time requirements to be maintained in order to capture and retain the data of the amplified data signal. Also, providing a self-timed latch that does not have a clock input may allow for reduction in the load of the clock generating circuitry of an integrated circuit. It also may allow for a reduction in the circuitry to implement a latch and sense amplifier circuit in a memory device.

In other embodiments, the sense amplifier circuit and latch may have other configurations. For example, inverters 325 and 327 (which perform an inverting buffer function) may be replaced by non inverting buffers. In such an embodiment, transistors 337 and 335 would be replaced with P channel transistors and their current terminals would be connected power supply terminal VDD instead of VSS. Also in other embodiments, isolating transistors 306 and 308 may be removed. In other embodiments, other types of sense amplifier circuits maybe utilized including e.g. other sense amplifiers that provide an amplified differential output.

Figure 5:
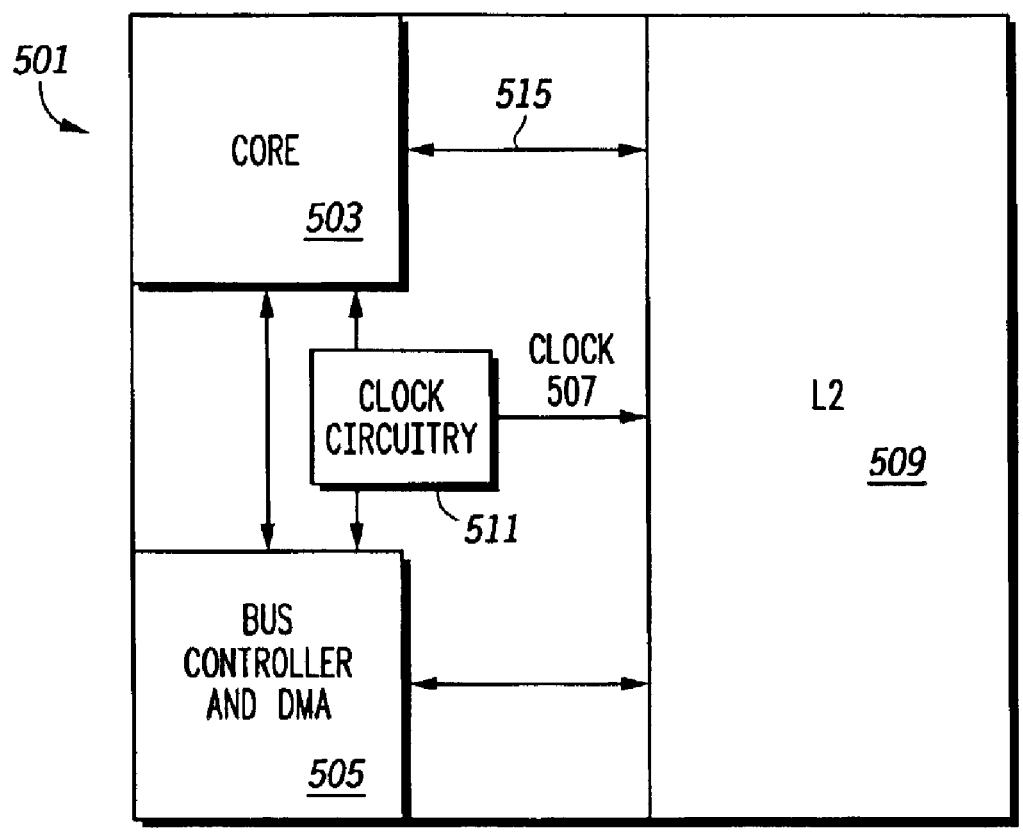
FIG. 5 is a block diagram of one embodiment of an integrated circuit according to the present invention.

FIG. 5 is a block diagram of one embodiment of an integrated circuit according to the present invention. Integrated circuit 501 includes a core processor 503, clock circuitry 511, bus controller and direct memory access circuitry 505, and an L2 cache 509. In one embodiment, bus controller and direct memory access circuitry 505 includes one or more bus controllers, with each bus controller coupled to a different system bus (such as e.g. a PCI bus). L2 cache 509 includes a plurality of columns, with each including a sense amplifier circuit, self timing latch, and circuit portion similar to sense amplifier circuit 213, self-timing latch 215, and circuit potion 309 of FIG. 3. Clock circuitry 511 provides a clock signal. Core processor 503 provides row and column address to L2 cache 509 via bus 515 and receives data from L2 cache 509 via bus 515. Integrated circuit 501 may also include other devices such as other bus controllers and memories (e.g. RAM or Flash). In one embodiment, integrated circuit 501 is a communications processing circuit for operably coupling busses of different protocols.

In other embodiments, the sense amplifier circuit self-timed latch and column logic described herein may be used in other types of memory devices. For example, these circuits may be used in embedded memory circuits (e.g. embedded RAM or ROM) or in stand alone memory devices.

In one aspect of the invention, a memory device includes a plurality of memory cells. Each of the plurality of memory cells is coupled to a bit line. The memory device also includes a sense amplifier for amplifying a data signal from a selected one of the plurality of memory cells via the bit line to provide an amplified data signal in response to asserting a sense enable signal. The memory device further includes an isolation circuit coupled between the bit line and the sense amplifier. The isolation circuit is for decoupling the selected one of the plurality of memory cells from the sense amplifier at about the same time as the assertion of the sense enable signal. The memory device also includes a self-timed storage device, coupled to the sense amplifier, for storing data corresponding to the amplified data signal only in response to the amplified data signal.

In another aspect of the invention, a memory device includes a plurality of memory cells. Each of the plurality of memory cells is coupled to a first bit line and to a second bit line. The memory device includes a first data line coupled to the first bit line during at least a portion of a read cycle and a second data line coupled to the second bit line during at least a portion of the read cycle. The memory device further includes a sense amplifier having a pair of cross-coupled inverters. The pair of cross-coupled inverters is coupled to the first data line and to the second data line for amplifying a data signal from a selected one of the plurality of memory cells in response to asserting a sense enable signal. The memory device also includes a first buffer circuit having an input coupled to the first data line and an output, a second buffer circuit having an input coupled to the second data line and an output, and a self-timed storage device having a first input coupled to the output of the first buffer circuit and a second input coupled to the output of the second buffer circuit. The self-timed storage device is responsive only to a differential voltage between the output of the first buffer circuit and the output of the second buffer circuit.

In another aspect, the invention includes a method for reading a memory cell of a memory device. The memory device includes a plurality of memory cells. Each of the plurality of memory cells is coupled to a bit line and to a word line. The method includes selecting at least one of the plurality of memory cells and sensing and amplifying a voltage on the bit line using a sense amplifier in response to asserting a sense enable signal to produce an amplified data signal. The amplified data signal is representative of a logic state stored in the at least one of the plurality of memory cells selected by the selecting. The method also includes decoupling the bit line from the sense amplifier at about the same time as the sense enable signal is asserted and latching data corresponding to the amplified data signal in a self-timed latch. The self-timed latch latching the data in response to only the amplified data signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory device, comprising:

a plurality of memory cells, each of the plurality of memory cells coupled to a bit line;

a sense amplifier for amplifying a data signal from a selected one of the plurality of memory cells via the bit line to provide an amplified data signal in response to asserting a sense enable signal;

an isolation circuit, coupled between the bit line and the sense amplifier, the isolation circuit for decoupling the selected one of the plurality of memory cells from the sense amplifier at about the same time as the assertion of the sense enable signal; and a self-timed storage device, coupled to the sense amplifier, for storing data corresponding to the amplified data signal only in response to the amplified data signal.

2. The memory device of claim 1, wherein the memory device is implemented on an integrated circuit.

3. The memory device of claim 1, wherein the memory device is characterized as being a static random access memory (SRAM).

4. The memory device of claim 1, wherein:

the data signal is a differential data signal;

the amplified data signal is an amplified differential data signal;

the sense amplifier comprises a pair of cross-coupled inverters, the pair of cross-coupled inverters being coupled to amplify the differential data signal to provide the amplified differential data signal in response to the sense enable signal.

5. The memory device of claim 1, wherein the self-timed storage device comprises:

a first transistor having a first current electrode, a second current electrode coupled to a power supply voltage terminal, and a control electrode coupled to a first data line;

a second transistor having a first current electrode, a second current electrode coupled to the power supply voltage terminal, and a control electrode coupled to a second data line;

a first inverter having an input coupled to the first current electrode of the first transistor, and an output coupled to the first current electrode of the second transistor; and a second inverter having an input coupled to the first current electrode of the second transistor and an output coupled to the first current electrode of the first transistor.

6. The memory device of claim 1, wherein the sense amplifier comprises:

a first transistor having a first current electrode coupled to a first power supply voltage terminal, a second current electrode coupled to a first data line, and a control electrode;

a second transistor having a first current electrode coupled to the second current electrode of the first transistor, a second current electrode, and a control electrode coupled to the control electrode of the first transistor;

a third transistor having a first current electrode coupled to the first power supply voltage terminal, a second current electrode coupled to the control electrode of the first transistor and to a second data line, and a control electrode coupled to the second current electrode of the first transistor;

a fourth transistor having a first current electrode coupled to the second current electrode of the third transistor, a second current electrode, and a control electrode coupled to the control electrode of the third transistor; and a fifth transistor having a first current electrode coupled to the second current electrodes of both the second and fourth transistors, a second current electrode coupled to a second power supply voltage terminal, and a control electrode for receiving the sense enable signal.

7. The memory device of claim 1, wherein the data signal is a differential data signal provided on a first bit line and a second bit line, and the isolation circuit further comprising:

a first isolation transistor for selectively coupling the first bit line to a first data line; and a second isolation transistor for selectively coupling the second bit line to a second data line.

8. The memory device of claim 7 wherein the sense amplifier is coupled to the first data line and the second data line, the first isolation transistor for selectively coupling the first bit line to the sense amplifier, the second isolation transistor for selectively coupling the second bit line to the sense amplifier.

9. The memory device of claim 7, further comprising:

a precharge circuit coupled to the first and second data lines, the precharge circuit for precharging the first and second data lines prior to the assertion of the sense enable signal.

10. The memory device of claim 7, further comprising:

a first inverter having an input coupled to the first data line and an output coupled to a first input of the self-timed storage device;

a second inverter having an input coupled to the second data line and an output coupled to a second input of the self-timed storage device.

11. The memory device of claim 10, wherein the self-timed storage device comprises:

a first transistor having a first current electrode, a second current electrode coupled to a power supply voltage terminal, and a control electrode coupled to the first data line;

a second transistor having a first current electrode, a second current electrode coupled to the power supply voltage terminal, and a control electrode coupled to the second data line;

a first inverter having an input coupled to the first current electrode of the first transistor, and an output coupled to the first current electrode of the second transistor; and a second inverter having an input coupled to the first current electrode of the second transistor and an output coupled to the first current electrode of the first transistor.

12. A memory device comprising:

a plurality of memory cells, each of the plurality of memory cells coupled to a first bit line and to a second bit line;

a first data line coupled to the first bit line during at least a portion of a read cycle;

a second data line coupled to the second bit line during at least a portion of the read cycle;

a sense amplifier having a pair of cross-coupled inverters, the pair of cross-coupled inverters being coupled to the first data line and to the second data line for amplifying a data signal from a selected one of the plurality of memory cells in response to asserting a sense enable signal;

a first buffer circuit having an input coupled to the first data line and an output;

a second buffer circuit having an input coupled to the second data line and an output;

a self-timed storage device having a first input coupled to the output of the first buffer circuit and a second input coupled to the output of the second buffer circuit, the self-timed storage device responsive only to a differential voltage between the output of the first buffer circuit and the output of the second buffer circuit.

13. The memory device of claim 12, wherein the plurality of memory cells is characterized as being a plurality of static random access memory (SRAM) cells.

14. The memory device of claim 12, wherein the memory device is part of an integrated circuit.

15. The memory device of claim 12, further comprising:
a first isolation transistor for selectively coupling the first bit line to the first data line; and
a second isolation transistor for selectively coupling the second bit line to the second data line.

16. The memory device of claim 15, wherein the first and second isolation transistors decouple the first and second data lines from the first and second bit lines at about the same time as the assertion of the sense enable signal.

17. The memory device of claim 12, wherein the sense amplifier comprises:
a first transistor having a first current electrode coupled to a first power supply voltage terminal, a second current electrode coupled to the first data line, and a control electrode;
a second transistor having a first current electrode coupled to the second current electrode of the first transistor, a second current electrode, and a control electrode coupled to the control electrode of the first transistor;
a third transistor having a first current electrode coupled to the first power supply voltage terminal, a second current electrode coupled to the control electrode of the first transistor and to the second data line, and a control electrode coupled to the second current electrode of the first transistor;
a fourth transistor having a first current electrode coupled to the second current electrode of the third transistor, a second current electrode, and a control electrode coupled to the control electrode of the third transistor; and
a fifth transistor having a first current electrode coupled to the second current electrodes of both the second and fourth transistors, a second current electrode coupled to a second power supply voltage terminal, and a control electrode for receiving the sense enable signal.

18. The memory device of claim 12, wherein the self-timed storage device comprises:
a first transistor having a first current electrode, a second current electrode coupled to a power supply voltage terminal, and a control electrode coupled to the first data line;
a second transistor having a first current electrode, a second current electrode coupled to the power supply voltage terminal, and a control electrode coupled to the second data line;
a first inverter having an input coupled to the first current electrode of the first transistor, and an output coupled to the first current electrode of the second transistor; and
a second inverter having an input coupled to the first current electrode of the second transistor and an output coupled to the first current electrode of the first transistor.

19. The memory device of claim 12, wherein the first and second buffer circuits are first and second inverters, respectively.

20. The memory device of claim 12, further comprising a precharge circuit coupled to the first and second data lines, the precharge circuit for precharging the first and second data lines prior to the assertion of the sense enable signal.

21. The memory device of claim 12, wherein the sense enable signal is generated from a clock signal.

22. A method for reading a memory cell of a memory device, the memory device comprising a plurality of memory cells, each of the plurality of memory cells coupled to a bit line and to a word line, the method comprising:
selecting at least one of the plurality of memory cells;
sensing and amplifying a voltage on the bit line using a sense amplifier in response to asserting a sense enable signal to produce an amplified data signal, the amplified data signal representative of a logic state stored in the at least one of the plurality of memory cells selected by the selecting;
decoupling the bit line from the sense amplifier at about the same time as the sense enable signal is asserted; and
latching data corresponding to the amplified data signal in a self-timed latch, the self-timed latch latching the data in response to only the amplified data signal.

23. The method of claim 22, wherein the memory device is characterized as being a static random access memory (SRAM).

24. The method of claim 22, wherein the sense enable signal is generated from a clock signal.

25. The method of claim 22 wherein the amplified data signal is produced on a data line, the method further comprising precharging the data line prior to the assertion of the sense enable signal.

26. The method of claim 22 further comprising:
prior to the sensing and amplifying, coupling the bit line to a data line wherein, the
coupling includes coupling the sense amplifier to the bit line via the data line;
wherein the amplified data signal is produced on the data line;
wherein the decoupling the bit line from the sense amplifier includes decoupling the bit line from the data line.

27. The method of claim 22 wherein the data remains latched until an other amplified data signal representative of an opposite logic state to the logic state is produced using the sense amplifier during a memory read cycle subsequent to the sensing and amplifying.

28. The method of claim 22 wherein:
the sensing and amplifying a voltage includes sensing and amplifying a differential voltage;
the amplified data signal is an amplified differential data signal.

29. A method for reading a memory cell of a memory device, the memory device comprising a plurality of memory cells, the method comprising:
selecting at least one of the plurality of memory cells;
sensing and amplifying a voltage using a sense amplifier in response to asserting a sense enable signal to produce an amplified data signal on a line, the amplified data signal representative of a logic state stored in the at least one of the plurality of memory cells selected by the selecting;

latching data corresponding to the amplified data signal in a self-timed latch, the self-timed latch latching the data in response to only the amplified data signal;

precharging the line after the sensing and amplifying, wherein the data remains latched at least during an initial portion of the precharging.

30. The method of claim 29 wherein the data remains latched until an other amplified data signal representative of an opposite logic state to the logic state is produced on the line during a memory read cycle subsequent to the sensing and amplifying.

31. The method of claim 29 wherein:

the sensing and amplifying a voltage includes sensing and amplifying a differential voltage;

the amplified data signal is an amplified differential data signal.

32. The method of claim 29, wherein the memory device is characterized as being a static random access memory (SRAM).

* * * * *